United States Patent
Sanada

(10) Patent No.: US 12,432,873 B2
(45) Date of Patent: Sep. 30, 2025

(54) FAN DUCT AND ELECTRONIC APPARATUS

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 250 days.

(21) Appl. No.: 18/335,164

(22) Filed: Jun. 15, 2023

(65) Prior Publication Data

US 2024/0049421 A1     Feb. 8, 2024

(30) Foreign Application Priority Data

Aug. 8, 2022   (JP) .................. 2022-126309

(51) Int. Cl.
*H05K 7/20*          (2006.01)

(52) U.S. Cl.
CPC ..... *H05K 7/20145* (2013.01); *H05K 7/20154* (2013.01)

(58) Field of Classification Search
CPC ... H01L 23/3672; H01L 23/4093; G06F 1/20; G06F 1/206; G06F 2200/201; G06F 1/203; H05K 7/20154; H05K 7/20145; H05K 7/2039; H05K 7/20172; H05K 7/20409; H05K 7/20727; H05K 7/20745; F24F 1/0029; F24F 1/0059; F24F 13/082; F24F 13/20; F24F 2013/0616; B60H 1/00042; B60H 1/00; B01D 2267/70; B01D 2273/14; B01D 2279/50; B01D 46/0006; B01D 46/12; B01D 46/18; F28D 2021/0029; F28D 5/00

See application file for complete search history.

(56) References Cited

U.S. PATENT DOCUMENTS

| | | | |
|---|---|---|---|
| 6,478,082 B1 * | 11/2002 | Li | F28F 13/003 257/E23.102 |
| 7,040,384 B2 * | 5/2006 | Shiang-Chich | H01L 23/4093 165/104.34 |
| 7,414,842 B2 * | 8/2008 | Hao | H01L 23/467 257/E23.099 |
| 7,492,590 B2 * | 2/2009 | Chen | H05K 7/20172 174/16.3 |

(Continued)

FOREIGN PATENT DOCUMENTS

JP          2003-283171          10/2003

*Primary Examiner* — Michael A Matey
(74) *Attorney, Agent, or Firm* — Amin, Turocy & Watson, LLP

(57) ABSTRACT

A fan duct includes a branch wall and ribs. The branch wall includes two plate-shaped portions that are continuous with each other at sides thereof on the upstream side in the air blowing direction of the fan and are inclined relative to the air blowing direction such that the two plate-shaped portions are separated from each other. A plurality of ribs that protrude from a surface of the branch wall facing the heat sink, each has a mountain-shaped plate shape with a most protruding top portion having an acute angle, each has a thickness equal to or less than an interval between fins of the heat sink, and the ribs are provided side by side in a thickness direction of the rib at an interval at which the rib is inserted between the fins.

19 Claims, 5 Drawing Sheets

(56) References Cited

U.S. PATENT DOCUMENTS

| | | | |
|---|---|---|---|
| 7,515,414 B2* | 4/2009 | Horng | H01L 23/467 |
| | | | 361/695 |
| 2005/0041392 A1* | 2/2005 | Chen | H05K 7/20727 |
| | | | 361/695 |
| 2007/0035926 A1* | 2/2007 | Xia | H01L 23/467 |
| | | | 257/E23.099 |
| 2007/0041159 A1* | 2/2007 | Bate | G11B 33/142 |
| 2007/0091566 A1* | 4/2007 | Sun | G06F 1/20 |
| | | | 361/695 |
| 2007/0097630 A1* | 5/2007 | Lee | H01L 23/427 |
| | | | 257/E23.099 |
| 2007/0144727 A1* | 6/2007 | Hirayama | B60H 1/0005 |
| | | | 165/203 |
| 2007/0165374 A1* | 7/2007 | Chen | H01L 23/467 |
| | | | 257/E23.099 |
| 2007/0256433 A1* | 11/2007 | Bhatti | F24F 1/035 |
| | | | 62/304 |
| 2008/0062641 A1* | 3/2008 | Lai | H01L 23/467 |
| | | | 257/E23.099 |
| 2009/0129018 A1* | 5/2009 | Zhou | H01L 23/467 |
| | | | 361/697 |
| 2012/0181003 A1* | 7/2012 | Zurowski | H05K 7/20154 |
| | | | 165/121 |
| 2014/0251322 A1* | 9/2014 | Miller | A61M 16/0891 |
| | | | 128/201.13 |
| 2020/0148025 A1* | 5/2020 | Tashima | B60H 1/3407 |
| 2024/0075754 A1* | 3/2024 | Mima | B41J 29/377 |
| 2024/0410598 A1* | 12/2024 | Sekito | F24F 13/24 |

\* cited by examiner

FAN DUCT AND ELECTRONIC APPARATUS

CROSS-REFERENCE TO RELATED APPLICATION

This application is based upon and claims the benefit of priority from Japanese Patent Application No. 2022-126309, filed on Aug. 8, 2022, the entire contents of which are incorporated herein by reference.

FIELD

Embodiments described herein relate generally to a fan duct and an electronic apparatus.

BACKGROUND

In the related art, an electronic apparatus such as a personal computer (PC) includes a component whose temperature increases such as a central processing unit (CPU). In general, a heat sink is attached to such a component for heat dissipation, further a fan and a fan duct are installed such that a gas (air) around the heat sink flows appropriately, and positions of an air inlet and an air outlet of the fan duct are determined.

Here, depending on an amount, an arrangement, and the like of components incorporated in a casing of the electronic apparatus, a component (obstacle) that prevents smooth passage of a gas may be disposed on downwind of the fan. In this case, heat dissipation performance deteriorates, which is not preferable.

DETAILED DESCRIPTION

In general, according to one embodiment, there are provided a fan duct and an electronic apparatus including the fan duct, which can achieve good heat dissipation performance if an obstacle is present on downwind of a fan that blows air for heat dissipation.

The fan duct according to an embodiment covers a heat sink attached to an electronic component and a fan for blowing air to the heat sink, the fan duct is provided with an air inlet on an upstream side in an air blowing direction of the fan and an air outlet on a downstream side, and the fan duct includes a branch wall and ribs. The branch wall includes two plate-shaped portions that are continuous with each other at sides thereof on the upstream side in the air blowing direction of the fan and are inclined relative to the air blowing direction such that the two plate-shaped portions are separated from each other toward the downstream side in the air blowing direction of the fan, and the branch wall is disposed on an inner side of edges of the air outlet. A plurality of ribs that protrude, by a distance larger than an interval between the branch wall and the heat sink, from a surface of the branch wall facing the heat sink, each of the ribs has a mountain-shaped plate shape with a most protruding top portion having an acute angle, each of the ribs has a thickness equal to or less than an interval between fins of the heat sink, and the plurality of ribs are provided side by side in a thickness direction of the rib at an interval at which the rib is inserted between the fins.

First Embodiment

Figure 1:
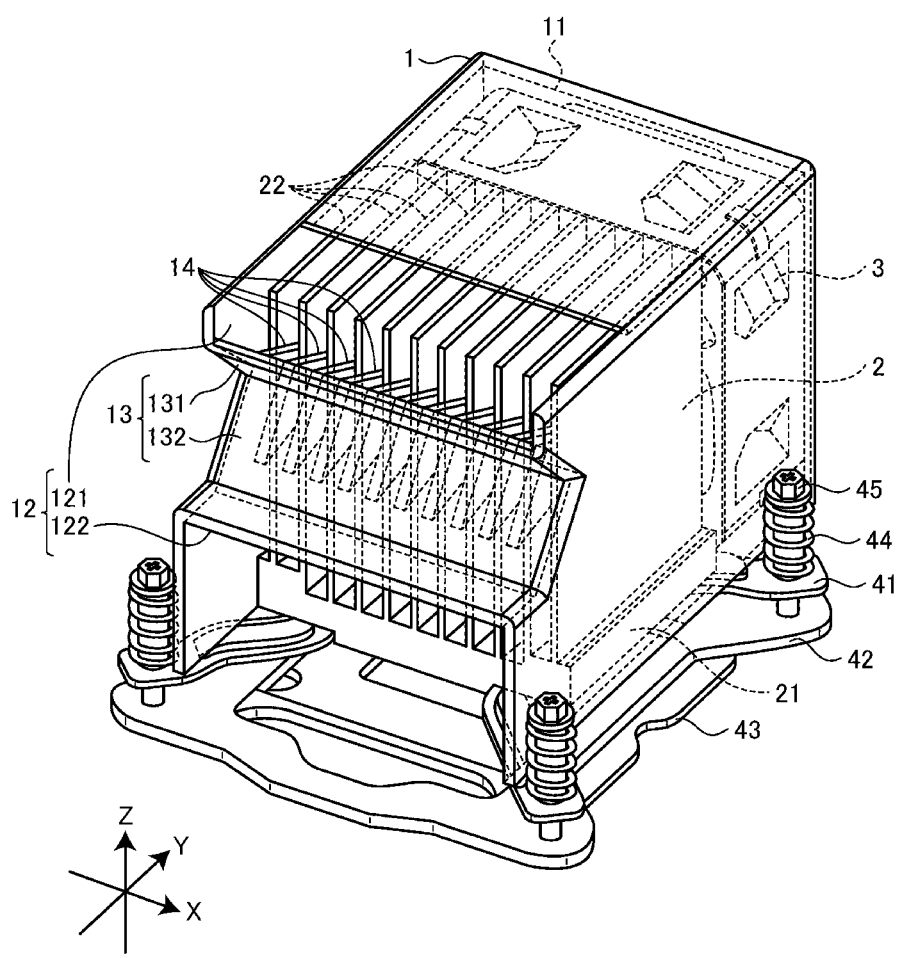
FIG. 1 is a perspective view illustrating an example of an appearance of a fan duct according to a first embodiment.
Figure 2:
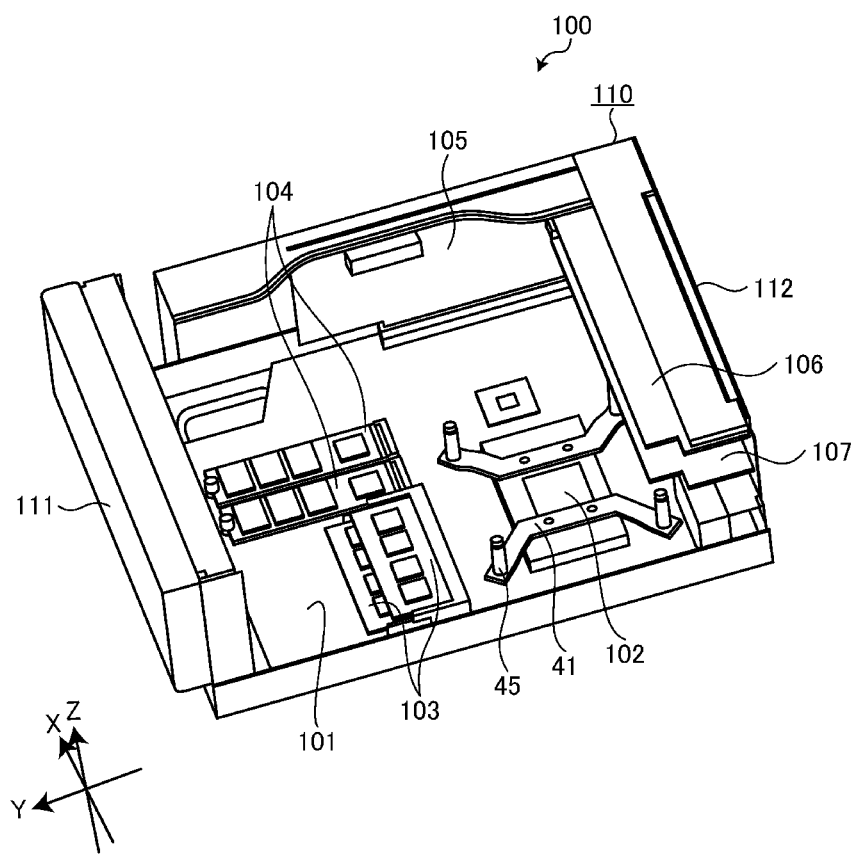
FIG. 2 is a perspective view schematically illustrating an example of a structure of an electronic apparatus to which the fan duct is attached.

Embodiments will be described with reference to the drawings. FIG. 1 is a perspective view illustrating an example of an appearance of a fan duct 1 according to a first embodiment. FIG. 2 is a perspective view schematically illustrating an example of a structure of an electronic apparatus 100 to which the fan duct 1 is attached. Here, for the convenience of explanation, a three-dimensional coordinate system is illustrated in the drawings. In the three-dimensional coordinate system, a width direction (left-right direction) of the fan duct 1 and the electronic apparatus 100 is defined as an X-axis direction, a depth direction (front-rear direction) is defined as a Y-axis direction, and a height direction (up-down direction) is a Z-axis direction. A positive direction of a Y axis is a direction from a back surface side to a front surface side of the electronic apparatus 100, and the positive direction of the Y axis is referred to as "front". A positive direction of a Z axis is a direction from bottom to top.

First, as shown in FIG. 1, the fan duct 1 has a substantially box shape, and covers a heat sink 2 and a fan 3 that blows air to the heat sink 2. The fan 3 blows air in a negative direction (rearward) of the Y axis. In the fan duct 1, an air inlet 11 is provided at a position on an upstream side in an air blowing direction of the fan 3, and an air outlet 12 is provided at a position on a downstream side.

Hereinafter, the term "upstream side" refers to an upstream side (or an upwind side) based on the air blowing direction (the negative direction of the Y axis) of the fan 3. Similarly, the term "downstream side" refers to a downstream side (or a downwind side) based on the air blowing direction of the fan 3.

The heat sink 2 is attached to a heat-generating electronic component. The "heat-generating electronic component" is, for example, a central processing unit (CPU). Heat generated by the CPU is conducted to the heat sink 2, and heat in the heat sink 2 is dissipated to a surrounding gas (air). Accordingly, malfunction or the like due to overheating of the CPU is prevented.

The heat sink 2 includes a pedestal portion 21 and a plurality of fins 22. The fins 22 are provided upright on the pedestal portion 21. The plurality of fins 22 are adjacent to one another at a predetermined interval. The pedestal portion 21 is in contact with the CPU, and conducts heat of the CPU. The fins 22 dissipate the heat conducted from the pedestal portion 21 coupled to the fins 22 into the air.

The heat sink 2 is fixed onto frames 41 to 43 that are layered at a predetermined interval by helical springs 44 and screws 45. A mother board 101 (see FIG. 2) is interposed between the frame 41 and the frame 42.

The fan 3 blows air by continuously blowing a gas in one direction using rotating blades. In the present embodiment, the air inlet 11, the fan 3, the heat sink 2, and the air outlet 12 are arranged in this order from upstream to downstream in the air blowing direction of the fan 3. The gas (air) taken in and sent from the air inlet 11 by the fan 3 flows mainly around the fins 22 of the heat sink 2 to take heat of the fins 22, and is discharged from the air outlet 12.

The fan duct 1 enables air blown by the fan 3 to efficiently act on heat dissipation of the heat sink 2 and improves a heat dissipation effect. Specifically, the fan duct 1 surrounds the heat sink 2, and a gas in the fan duct 1 is replaced with a gas taken in from the air inlet 11 by the rotation of the fan 3 and is pushed out from the air outlet 12. Accordingly, a gas surrounding the heat sink 2 is quickly replaced.

For the convenience of operating the fan duct 1 as described above, it is desirable that no component (obstacle) that prevents air exhaust is present downwind of the air outlet 12. However, depending on a size of the electronic apparatus 100 including the fan duct 1, an arrangement of incorporated components, or the like, an obstacle may be disposed downstream of the air outlet 12.

As illustrated in FIG. 2, the electronic apparatus 100 includes the mother board 101, a CPU 102, a memory 103, a solid state drive (SSD) 104, a riser card 105, expansion boards 106 and 107 such as I/O boards, and a casing 110.

The casing 110 houses the above-described units (the mother board 101, the CPU 102, the memory 103, the SSD 104, the riser card 105, and the expansion boards 106 and 107 such as I/O boards).

The mother board 101 is an example of a substrate on which an electronic component (the CPU 102 in the present embodiment) whose heat is to be dissipated by the heat sink 2 is mounted. The memory 103 and the SSD 104 also generate heat in accordance with operations. The heat is also dissipated by a flow of gas in the casing 110 created by air blown by the fan 3.

The expansion boards 106 and 107 can be directly coupled to the mother board 101. In this case, the expansion boards 106 and 107 stand upright on the mother board 101, and thus it is necessary to increase a dimension of the casing 110 in a height direction, which increases a size of the electronic apparatus 100. The riser card 105 is used to prevent the size of the electronic apparatus 100 from being increased.

The riser card 105 mediates coupling between the expansion boards 106 and 107 and the mother board 101. The riser card 105 includes one or more slots for receiving insertion of the expansion boards 106 and 107, and is inserted into a slot of the mother board 101. By using the riser card 105, the expansion boards 106 and 107 are positioned substantially parallel to the mother board 101 without standing upright on the mother board 101 and are coupled to the mother board 101. Accordingly, it is possible to reduce a height dimension of the casing 110.

In the arrangement described above, the expansion boards 106 and 107 are positioned downstream of the air outlet 12 in the air blowing direction of the fan 3. In this case, if an air exhaust direction from the air outlet 12 is a backward direction (the negative direction of the Y axis), the expansion boards 106 and 107 become obstacles that prevent air exhaust. In the present embodiment, an air exhaust direction is made in a manner of avoiding the expansion boards 106 and 107.

Figure 3:
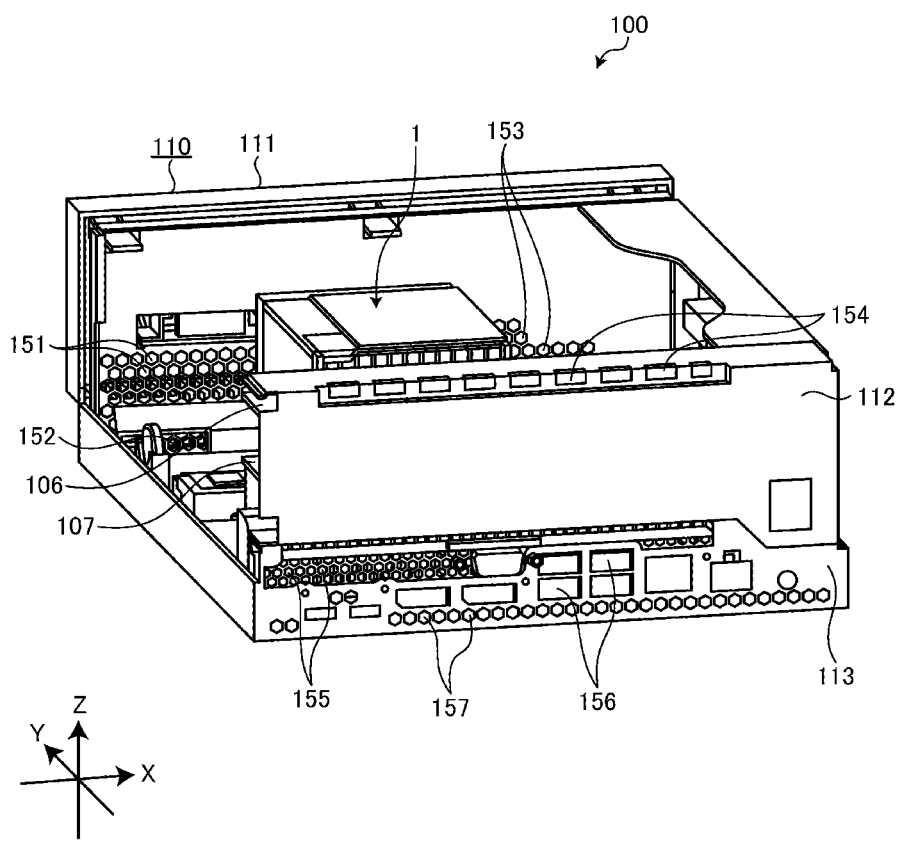
FIG. 3 is a perspective view illustrating an example of ventilation holes attached to the electronic device.

FIG. 3 is a perspective view illustrating an example of the ventilation holes 151 to 157 provided in the electronic apparatus 100. This perspective view is a view of the electronic apparatus 100 as viewed from a back side.

The electronic apparatus 100 includes the fan duct 1, the heat sink 2 and the fan 3 that are covered with the fan duct 1, the mother board 101, and the casing 110. The casing 110 houses the mother board 101 and the fan duct 1, and the casing 110 is provided with the ventilation holes 151 to 157 for air intake and exhaust.

The casing 110 includes a front cover 111, a back cover 112, and an I/O panel 113. The front cover 111 constitutes a front surface of the casing 110. The front cover 111 is provided with the ventilation holes 151 to 153. The back cover 112 constitutes a back surface of the casing 110. The back cover 112 is provided with the ventilation holes 154 and 155. The ventilation hole 154 is positioned in an upper portion of the back surface of casing 110. The ventilation hole 155 is positioned in a lower portion of the back surface of casing 110.

The I/O panel 113 constitutes a part of the back surface of the casing 110. The I/O panel 113 is provided with the ventilation holes 156 and 157. The ventilation holes 156 and 157 are positioned in a lower portion of the back surface of the casing 110. The ventilation hole 156 is an opening for receiving insertion of a connector into an I/O board (the expansion boards 106 and 107).

The ventilation holes 151 to 157 are used for gas (air) intake and exhaust. Among the ventilation holes 151 to 157, the ventilation holes 154 to 156 provided in the back surface of the casing 110 are mainly used for air exhaust.

In the electronic apparatus 100 according to the present embodiment, the expansion boards 106 and 107 are disposed in the rear of the CPU 102. Therefore, the air outlet 12 of the fan duct 1 is divided into an air outlet 121 that is opened toward upward and rearward, and an air outlet 122 that is opened toward downward and rearward, so that exhausted air avoids the expansion boards 106 and 107 (see FIG. 1). The air outlet 12 is divided by a branch wall 13 and ribs 14. The ribs 14 stand on a surface of the branch wall 13 on a heat sink 2 side. A plurality of the ribs 14 are arranged in the left-right direction at a regular interval. More specifically, the plurality of ribs 14 are provided side by side in a thickness direction of the rib 14 at an interval at which the rib 14 is inserted between the fins 22. At least a tip end portion of the rib 14 is inserted between the fins 22.

Figure 4:
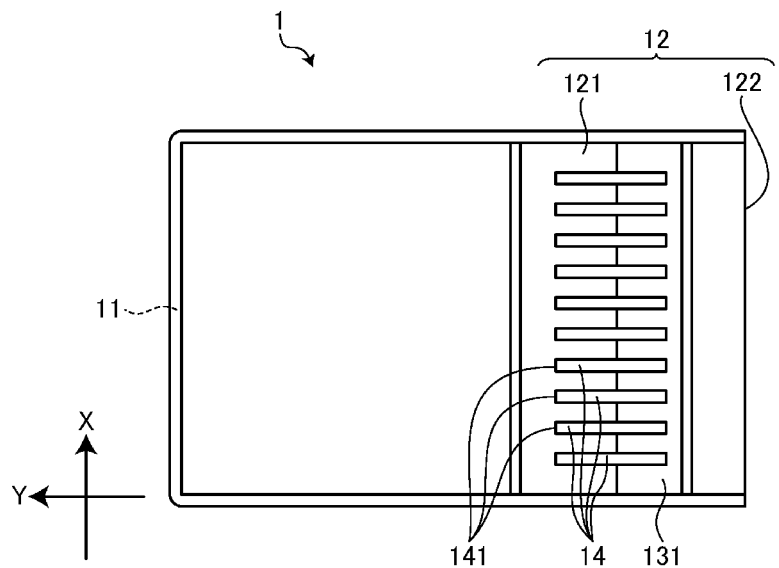
FIG. 4 is a plan view illustrating a shape of the fan duct.
Figure 5:
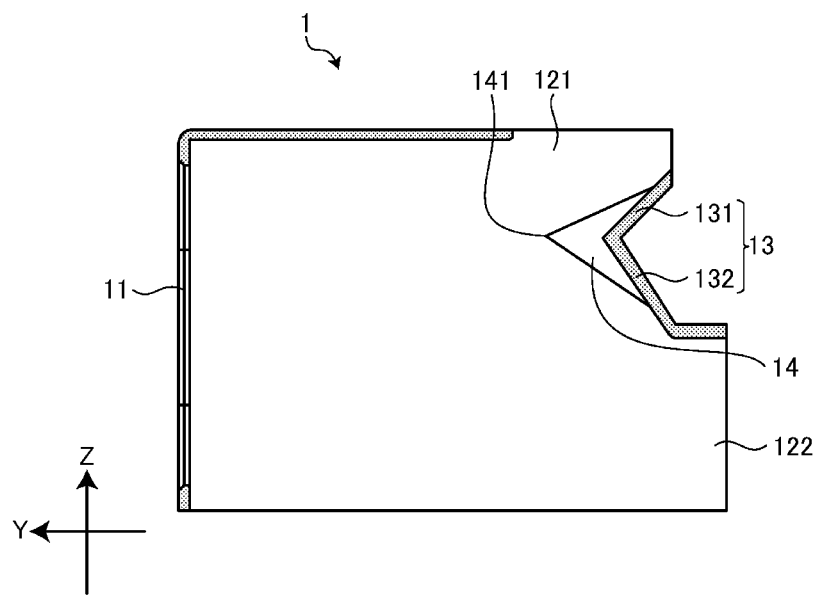
FIG. 5 is a longitudinal cross sectional side view illustrating the shape.

Here, shapes of the branch wall 13 and the ribs 14 will be described in more detail with reference to FIGS. 4 and 5. FIG. 4 is a plan view illustrating the shape of the fan duct 1. FIG. 5 is a longitudinal cross sectional side view illustrating the shape of the fan duct 1.

The branch wall 13 is disposed on an inner side of edges of the air outlet 12 and divides the air outlet 12 into the air outlet 121 and the air outlet 122. The branch wall 13 has a substantially V-shaped cross section in a side view, and a bent portion of the branch wall 13 protrudes toward the heat sink 2. Accordingly, a flow direction of a gas passing through the heat sink 2 is divided into two flow directions.

More specifically, the branch wall 13 includes two plate-shaped portions 131 and 132. The plate-shaped portions 131 and 132 are continuous with each other at upstream sides of the plate-shaped portions 131 and 132. The plate-shaped portions 131 and 132 are inclined relative to the air blowing direction of the fan 3 such that a distance between the plate-shaped portions 131 and 132 increases toward downstream. The first plate-shaped portion 131 guides a flow direction of a gas obliquely upward. The second plate-shaped portion 132 guides a flow direction of a gas obliquely downward. Accordingly, the branch wall 13 guides an exhausted gas in a manner of avoiding a partial range downstream of the branch wall 13, and the exhausted gas branches.

An angle between each of the two plate-shaped portions 131 and 132 of the branch wall 13 and the air blowing direction (the negative direction of the Y axis) of the fan 3 is 45° or more, and the angle between the two plate-shaped portions 131 and 132 is a right angle (90°) or an obtuse angle slightly larger than a right angle. Angle setting and the like of the branch wall 13 are determined in consideration of a service life and ease of manufacturing a mold.

The rib 14 is provided in a manner of protruding by a distance larger than an interval between the branch wall 13 and the heat sink 2, from a surface of the branch wall 13 facing the heat sink 2. The rib 14 has a thickness equal to or less than an interval between the fins 22 of the heat sink 2, and has a mountain-shaped plate shape. Edges of the mountain shape of the rib 14 according to the present embodiment are formed in a linear shape.

The edges of the mountain shape of the rib 14 are inclined relative to the air blowing direction. An angle formed by each of the edges of the mountain shape of the rib 14 and the air blowing direction (the negative direction of the Y axis) of the fan 3 is effectively set in a range of 20° to 45°, and more preferably is set to about 30°. An angle of the mountain shape of a top portion 141 which is a most protruding portion is an acute angle.

The above-described angle setting of the rib 14 and the like are determined such that a desired effect can be obtained based on a simulation result of a cooling effect (which will be described later) and a mold can be designed.

For example, if the angle formed by each of the edges of the mountain shape of the rib 14 and the air blowing direction of the fan 3 is too large, a desired effect cannot be obtained. In order to obtain a desired effect, it is desirable that the angle is set to at least 45° or less.

If the angle formed by each of the edges of the mountain shape of the rib 14 and the air blowing direction of the fan 3 is too small (for example, less than 20°), the top portion 141 of the rib 14 becomes too sharp, and filling failure is likely to occur during molding, which is not preferable. Further, in this case, if the rib 14 is made long (a dimension from the top portion 141 to a base portion is large) in order to sufficiently secure the dimension in a height direction from the base portion, the rib 14 does not fit in the air outlet 121 in a plan view (as viewed from a negative direction of the Z axis), and a structure of a mold becomes complicated.

In order to obtain a desired effect by avoiding the above-described inconvenience and to enable molding with a simple mold having a structure in which filling failure is less likely to occur, the angle formed by each of the edges of the mountain shape of the rib 14 and the air blowing direction of the fan 3 is preferably 20° or more and 45° or less, and is preferably about 30°.

If a thickness of the base portion of the rib 14 is 3 mm or less, a sink mark is less likely to occur, and there is no need to perform thinning using a mold. Since there is no wall on upper and lower sides of the rib 14, the rib 14 can be molded by a normal cavity core. Accordingly, a tip end of the rib 14 can be formed to have a sharp shape.

Figure 6:
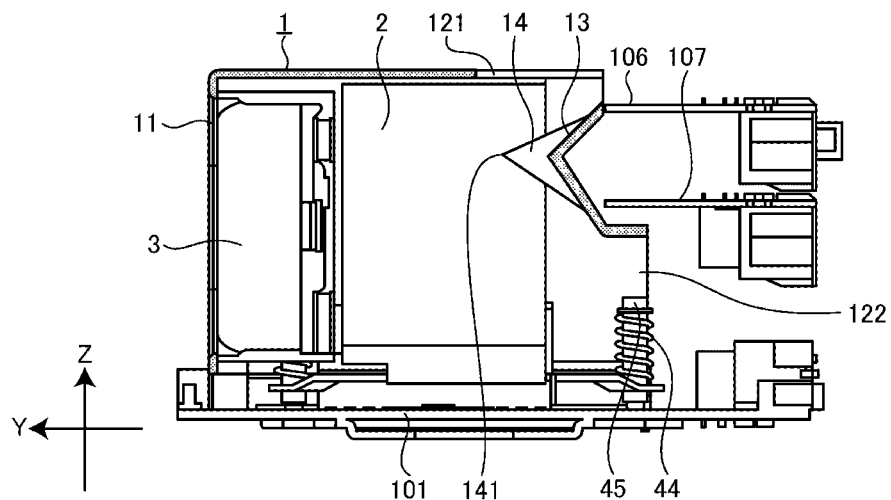
FIG. 6 is a longitudinal cross sectional side view illustrating a positional relationship between the fan duct and components near air outlets.
Figure 7:
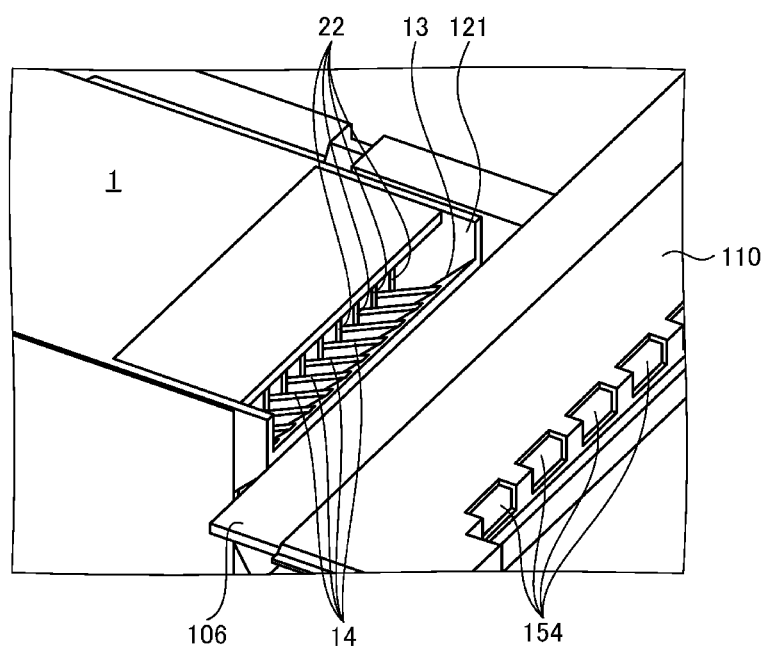
FIG. 7 is a perspective view illustrating an arrangement state of the air outlets.

FIG. 6 is a longitudinal cross sectional side view illustrating a positional relationship between the fan duct 1 and components (the expansion boards 106 and 107) near the air outlet 12 (the air outlets 121 and 122). FIG. 7 is a perspective view illustrating an arrangement state of the air outlet 121 of the fan duct 1 attached to the electronic apparatus 100. As described above, an air exhaust direction of the air outlets 121 and 122 is set in a manner in which an exhausted gas avoids the components (the expansion boards 106 and 107) near the air outlets 121 and 122 and passes around the components.

In such a configuration, if the electronic apparatus 100 is energized and operated, the CPU 102, the SSD 104, and the like generate heat, and temperature rises. If the fan 3 is operated to blow air, a gas in the fan duct 1 and the casing 110 flows and is ventilated, so that heat of the CPU 102 and the like is removed and overheating of the CPU 102 and the like is prevented.

Here, if the fan duct 1 does not include the branch wall 13 and the ribs 14 according to the present embodiment, in simulation of an arrangement as illustrated in FIG. 2, the CPU 102 has a temperature of 79.7° C., and the two SSDs 104 respectively have temperatures of 62.6° C. and 62.1° C. (this simulation is hereinafter referred to as "simulation A").

In contrast to the simulation described above, if the branch wall 13 and the ribs 14 are provided as in the present embodiment, in similar simulation, the CPU 102 has a temperature of 68.9° C., and the two SSDs 104 respectively have temperatures of 54.2° C. and 52.3° C. (this simulation is hereinafter referred to as "simulation B").

In simulation of the fan duct 1 in which only the branch wall 13 is provided and the ribs 14 are not provided, the CPU 102 has a temperature of 69.5° C. and the two SSDs 104 respectively have temperatures of 54.2° C. and 52.5° C. (this simulation is hereinafter referred to as "simulation C"). That is, it can be said that a heat dissipation effect is improved in a case where the ribs 14 are provided as compared with a case where the ribs 14 are not provided.

In the simulations A to C described above, the fan 3 having a specification in which an intersection (an operating point) between an air volume and static pressure characteristic graph of the fan 3 and a ventilation resistance graph of the electronic apparatus 100 is at an appropriate position is selected, and then a shape and a size of the ribs 14, an inclination angle of each of the plate-shaped portions 131 and 132 of the branch wall 13, and the like are adjusted. In the adjustment, a realistic value is set such that a mold of the fan duct 1 can be manufactured or life is not shortened.

According to simulation, in the simulation C (only the branch wall 13 is provided and the ribs 14 are not provided), the operating point moved to a side where the air volume is large, as compared with the simulation A (the branch wall 13 and the ribs 14 are not provided). In the simulation B (the branch wall 13 and the ribs 14 are provided), the operating point remained almost unchanged, and a maximum air speed increased as compared with the simulation C. According to simulation, it can be said that an air volume increases at least by appropriately providing the branch wall 13, and a maximum air speed increases at least by appropriately providing the ribs 14. Accordingly, heat dissipation performance can be improved.

As described above, according to the fan duct 1 in the first embodiment, even if an obstacle is present downwind of the fan duct 1, it is possible to exhaust a gas while avoiding the obstacle, and it is possible to appropriately dissipate heat generated inside the electronic apparatus 100.

As in the present embodiment, if a predetermined range including at least the tip end of the rib 14 is inserted between the fins 22, most gases flowing between the adjacent fins 22 are guided upward and downward and branch before flowing out from the fins 22. In this case, good heat dissipation performance can be obtained as compared with a case in which the rib 14 is spaced downstream of the fins 22 instead of being inserted between the fins 22.

Here, if the rib 14 is spaced downstream of the fins 22 instead of being inserted between the fins 22, gases in adjacent gaps on the downstream side of the fins 22 join with one another. In this case, it is considered that more loss occurs due to, for example, generation of a vortex at rear ends of the fins 22.

On the other hand, if the gases in adjacent gaps on the downstream side of the fins 22 branch before joining with one another, the occurrence of loss is prevented, and an air speed is likely to be maintained. Accordingly, the fan duct 1 according to the present embodiment can improve heat dissipation performance as compared with a case where the tip end of the rib 14 does not reach the fins 22.

As described above, according to the present embodiment, if an obstacle (the expansion boards 106 and 107 in the present embodiment) is present downwind of the fan 3 that blows air for heat dissipation, it is possible to provide the fan duct 1 and the electronic apparatus 100 including the fan duct 1 that have good heat dissipation performance.

The above-described embodiment can be appropriately modified and implemented by changing a part of configurations or functions of the above-described devices. Hereinafter, some modifications according to the above-described embodiment will be described as other embodiments. In the following description, points different from the above-described embodiment will be mainly described, and detailed description of points common to the contents described above will be omitted. Further, modifications to be described below may be implemented individually or may be implemented in combination as appropriate.

Second Embodiment

Although the edges of the mountain shape of the rib 14 according to the first embodiment are formed in a linear shape, the present disclosure is not limited thereto. For example, the edges of the mountain shape of the rib 14 may be curved or bent such that an angle of inclination of the rib 14 relative to the air blowing direction of the fan 3 gradually increases from the top portion 141 to the base portion. With such a configuration, resistance of the top portion 141 of the rib 14 applied to a gas flow may be reduced, and heat dissipation performance may be further improved.

While certain embodiments have been described, these embodiments have been presented by way of example only, and are not intended to limit the scope of the disclosure. Novel embodiments can be implemented in various other forms, and various omissions, substitutions, modifications, and combinations may be made within a scope not departing from the gist of the disclosure. The embodiments and modifications are included in the scope and the gist of the disclosure, and included in the disclosure described in the claims and the scope of equivalents of the disclosure.

Other than in the operating examples, if any, or where otherwise indicated, all numbers, values and/or expressions referring to parameters, measurements, conditions, etc., used in the specification and claims are to be understood as modified in all instances by the term "about."

What is claimed is:

1. A fan duct that covers a heat sink attached to an electronic component and a fan for blowing air to the heat sink and that is provided with an air inlet on an upstream side in an air blowing direction of the fan and an air outlet on a downstream side, the fan duct comprising:
a branch wall that comprises two plate-shaped portions and is disposed on an inner side of edges of the air outlet, the two plate-shaped portions continuous with each other at sides thereof on the upstream side in the air blowing direction of the fan and inclined relative to the air blowing direction such that the two plate-shaped portions are separated from each other toward the downstream side in the air blowing direction of the fan; and
a plurality of ribs that protrude, by a distance larger than an interval between the branch wall and the heat sink, from a surface of the branch wall facing the heat sink, each of which has a mountain-shaped plate shape with a most protruding top portion having an acute angle, each of the plurality of ribs has a thickness equal to or less than an interval between fins of the heat sink, and the plurality of ribs are provided side by side in a thickness direction of the rib at an interval at which the rib is inserted between the fins.

2. The fan duct according to claim 1, wherein
an angle formed by the two plate-shaped portions of the branch wall is a right angle or an obtuse angle.

3. The fan duct according to claim 1, wherein
an edge of the mountain shape of the rib is curved or bent such that an angle of inclination of the rib relative to the air blowing direction of the fan gradually increases from the top portion to a base portion.

4. The fan duct according to claim 1, wherein
an angle formed by an edge of the mountain shape of the rib and the air blowing direction of the fan is in a range from about 20 degrees to about 45 degrees.

5. An electronic apparatus, comprising:
a heat sink covered by a fan duct;
a fan covered by the fan duct;
a substrate on which an electronic component whose heat is to be dissipated by the heat sink is mounted; and
a casing in which the substrate and the fan duct are housed and that is provided with a ventilation hole for air intake and exhaust,
the fan duct comprising:
a branch wall that comprises two plate-shaped portions and is disposed on an inner side of edges of the air outlet, the two plate-shaped portions continuous with each other at sides thereof on the upstream side in the air blowing direction of the fan and inclined relative to the air blowing direction such that the two plate-shaped portions are separated from each other toward the downstream side in the air blowing direction of the fan; and
a plurality of ribs that protrude, by a distance larger than an interval between the branch wall and the heat sink, from a surface of the branch wall facing the heat sink, each of which has a mountain-shaped plate shape with a most protruding top portion having an acute angle, each of the plurality of ribs has a thickness equal to or less than an interval between fins of the heat sink, and the plurality of ribs are provided side by side in a thickness direction of the rib at an interval at which the rib is inserted between the fins.

6. The electronic apparatus according to claim 5, wherein the plurality of ribs stand on a surface of the branch wall on a heat sink side.

7. The electronic apparatus according to claim 5, wherein the electronic component is at least one of a mother board, a CPU, a memory, a solid state drive, a riser card, and an I/O board.

8. The electronic apparatus according to claim 5, wherein the casing is provided with a plurality of ventilation holes.

9. The electronic apparatus according to claim 5, wherein an angle formed by the two plate-shaped portions of the branch wall is a right angle or an obtuse angle.

10. The electronic apparatus according to claim 5, wherein
an edge of the mountain shape of the rib is curved or bent such that an angle of inclination of the rib relative to the air blowing direction of the fan gradually increases from the top portion to a base portion.

11. The electronic apparatus according to claim 5, wherein
an angle formed by an edge of the mountain shape of the rib and the air blowing direction of the fan is in a range from about 20 degrees to about 45 degrees.

12. A computing device, comprising:
a heat sink covered by a fan duct;
a fan covered by the fan duct;
a substrate on which a CPU whose heat is to be dissipated by the heat sink is mounted; and
a casing in which the substrate and the fan duct are housed and that is provided with a ventilation hole for air intake and exhaust,
the fan duct comprising:
a branch wall that comprises two plate-shaped portions and is disposed on an inner side of edges of the air outlet, the two plate-shaped portions continuous with each other at sides thereof on the upstream side in the air blowing direction of the fan and inclined relative to the air blowing direction such that the two plate-shaped portions are separated from each other toward the downstream side in the air blowing direction of the fan; and
a plurality of ribs that protrude, by a distance larger than an interval between the branch wall and the heat sink, from a surface of the branch wall facing the heat sink, each of which has a mountain-shaped plate shape with a most protruding top portion having an acute angle, each of the plurality of ribs has a thickness equal to or less than an interval between fins of the heat sink, and the plurality of ribs are provided side by side in a thickness direction of the rib at an interval at which the rib is inserted between the fins.

13. The computing device according to claim 12, wherein the plurality of ribs stand on a surface of the branch wall on a heat sink side.

14. The computing device according to claim 12, wherein the casing is provided with a plurality of ventilation holes.

15. The computing device according to claim 12, wherein
an angle formed by the two plate-shaped portions of the branch wall is a right angle or an obtuse angle.

16. The computing device according to claim 12, wherein
an edge of the mountain shape of the rib is curved or bent such that an angle of inclination of the rib relative to the air blowing direction of the fan gradually increases from the top portion to a base portion.

17. The computing device according to claim 12, wherein
an angle formed by an edge of the mountain shape of the rib and the air blowing direction of the fan is in a range from about 20 degrees to about 45 degrees.

18. The computing device according to claim 12, wherein the computing device is a personal computer.

19. The computing device according to claim 12, wherein the computing device is a point of sale terminal.

* * * * *